US012777667B2

(12) United States Patent
Chiu et al.

(10) Patent No.: US 12,777,667 B2
(45) Date of Patent: Oct. 27, 2026

(54) SEMICONDUCTOR STRUCTURE OF BIPOLAR JUNCTION TRANSISTOR (BJT)

(71) Applicant: MEDIATEK INC., Hsinchu City (TW)

(72) Inventors: Shih-Chuan Chiu, Hsinchu City (TW); Chia-Hsin Hu, Hsinchu City (TW); Zheng Zeng, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 536 days.

(21) Appl. No.: 18/327,287

(22) Filed: Jun. 1, 2023

(65) Prior Publication Data

US 2024/0014295 A1 Jan. 11, 2024

Related U.S. Application Data

(60) Provisional application No. 63/368,090, filed on Jul. 11, 2022.

(51) Int. Cl.
*H10D 10/60* (2025.01)
*H10D 62/13* (2025.01)
*H10D 62/17* (2025.01)

(52) U.S. Cl.
CPC ........... *H10D 10/60* (2025.01); *H10D 62/134* (2025.01); *H10D 62/137* (2025.01); *H10D 62/184* (2025.01)

(58) Field of Classification Search
CPC .... H10D 10/01; H10D 10/021; H10D 10/061; H10D 10/211; H10D 10/221; H10D 10/60; H10D 62/115; H10D 62/116; H10D 62/133; H10D 62/134; H10D 62/135; H10D 62/137; H10D 62/126; H10D 62/177; H10D 62/184; H10D 64/231; H10D 64/281; H10D 84/0156; H10D 84/0158; H10D 84/0191; H10D 84/0193; H10D 84/121;
(Continued)

(56) References Cited

U.S. PATENT DOCUMENTS 9,035,426 B2 * 5/2015 Chang .................. H10D 62/133
257/592
2010/0213504 A1 8/2010 Ko
(Continued)

OTHER PUBLICATIONS

German language office action dated Mar. 4, 2026, issued in application No. DE 10 2023 117 462.2 (English language translation, pp. 1-4 of attachment).

*Primary Examiner* — Natalia A Gondarenko
(74) *Attorney, Agent, or Firm* — McClure, Qualey & Rodack, LLP

(57) ABSTRACT

Semiconductor structures of bipolar junction transistor (BJT) are provided. A first active region of a collection region is formed over a first P-type well region. Second and third active regions of a base region are formed over an N-type well region. A fourth active region of an emitter region is formed over a second P-type well region. The first active region includes a plurality of first fins and a plurality of first source/drain features epitaxially grown on the first fins. Each of the second and third active regions includes a plurality of second fins and a plurality of second source/drain features epitaxially grown on the second fins. The fourth active region includes a plurality of third fins and a plurality of third source/drain features epitaxially grown on the third fins. The second and third active regions are disposed on opposite sides of the fourth active region.

19 Claims, 13 Drawing Sheets

(58) Field of Classification Search
CPC .. H10D 84/401; H10D 84/409; H10D 84/645; H10D 89/311; H10D 89/713; H10D 10/041; H10D 10/231; H10D 10/241; H10D 10/311; H10D 10/80; H10D 62/117; H10D 62/118; H10D 62/122; H10D 62/123; H10D 62/124; H10D 62/82; H10D 62/822
USPC ................ 257/586, 499, 565, 197, 592, 587
See application file for complete search history.

(56) References Cited

U.S. PATENT DOCUMENTS

| | | | | |
|---|---|---|---|---|
| 2010/0252860 | A1 | 10/2010 | Yang | |
| 2010/0289058 | A1 | 11/2010 | Yang | |
| 2017/0317197 | A1* | 11/2017 | Tseng | H10D 62/134 |
| 2018/0068998 | A1* | 3/2018 | Wang | H10D 62/184 |
| 2018/0323292 | A1 | 11/2018 | Cho | |
| 2021/0296309 | A1* | 9/2021 | Chang | H10D 62/184 |

* cited by examiner

SEMICONDUCTOR STRUCTURE OF BIPOLAR JUNCTION TRANSISTOR (BJT)

CROSS REFERENCE TO RELATED APPLICATIONS

This application claims priority of U.S. Provisional Application No. 63/368,090, filed on Jul. 11, 2022, the entirety of which is incorporated by reference herein.

BACKGROUND OF THE INVENTION

Field of the Invention

The invention relates to a bipolar junction transistor (BJT), and more particularly to a BJT with high beta gain.

Description of the Related Art

Bipolar junction transistors (BJTs), which can be formed using a CMOS compatible process, are key parts of analog integrated circuits such as band-gap voltage reference circuits. These circuits are often sensitive to the Vbe (base-emitter voltage) value and Vbe mismatch of BJT.

BRIEF SUMMARY OF THE INVENTION

Semiconductor structures are provided. A semiconductor structure includes a semiconductor substrate, a deep N-type well region, a first P-type well region, an N-type well region, a second P-type well region, and a bipolar junction transistor (BJT) that includes a first active region of a collection region, a second active region and a third active region of a base region, and a fourth active region of an emitter region. The deep N-type well region is formed in the semiconductor substrate. The first P-type well region is formed over the semiconductor substrate. The N-type well region is formed over the deep N-type well region and is surrounded by the first P-type well. The second P-type well region is formed over the deep N-type well region and is surrounded by the N-type well region. The first active region of a collection region is formed over the first P-type well region. The second active region and the third active region of a base region are formed over the N-type well region. The fourth active region of an emitter region is formed over the second P-type well region. The first active region includes a plurality of first fins extending in a first direction and a plurality of first source/drain features epitaxially grown on the first fins. Each of the second active region and the third active region includes a plurality of second fins extending in the first direction and a plurality of second source/drain features epitaxially grown on the second fins. The fourth active region includes a plurality of third fins extending in the first direction and a plurality of third source/drain features epitaxially grown on the third fins. The second and third active regions are disposed on opposite sides of the fourth active region in the first direction. In the first direction, the first active region is longer than the fourth active region, and the fourth active region is longer than the second and third active regions.

Furthermore, an embodiment of a semiconductor structure is provided. The semiconductor structure includes a semiconductor substrate, a deep N-type well region formed in the semiconductor substrate, a rectangular P-type well region formed over the deep N-type well region, a ring-shaped N-type well region formed over the deep N-type well region, a ring-shaped P-type well region formed over the semiconductor substrate, and a bipolar junction transistor (BJT) that including a plurality of first active regions of a collection region formed over the ring-shaped P-type well region, a plurality of second active regions of a base region formed over the ring-shaped N-type well region, and a plurality of third active regions of an emitter region formed over the rectangular P-type well region. The rectangular P-type well region is surrounded by the ring-shaped N-type well region. The ring-shaped N-type well region is surrounded by the ring-shaped P-type well region. Each of the first active regions includes a plurality of first fins extending in a first direction and a plurality of first source/drain features epitaxially grown on the first fins. Each of the second active regions includes a plurality of second fins extending in the first direction and a plurality of second source/drain features epitaxially grown on the second fins. Each of the third active region includes a plurality of third fins extending in the first direction and a plurality of third source/drain features epitaxially grown on the third fins. In the first direction, the first active regions are longer than the third active regions, and the third active regions are longer than the second active regions. The ring-shaped N-type well region between the first and third active regions is free of the second active region.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures.

Semiconductor devices employing higher device integration density, such as fin-base field effect transistor (FinFET) semiconductor devices. FinFET NMOS and/or PMOS transistors are formed in oxide definition (OD) regions. The OD region, sometimes labeled as an "oxide diffusion" area, defines an active region for the transistor, i.e., the region where the source, drain and channel under the gate of transistor are formed. The active region is defined to be between inactive areas, such as shallow trench isolation (STI) or field oxide (FOX) region.

Figure 1:
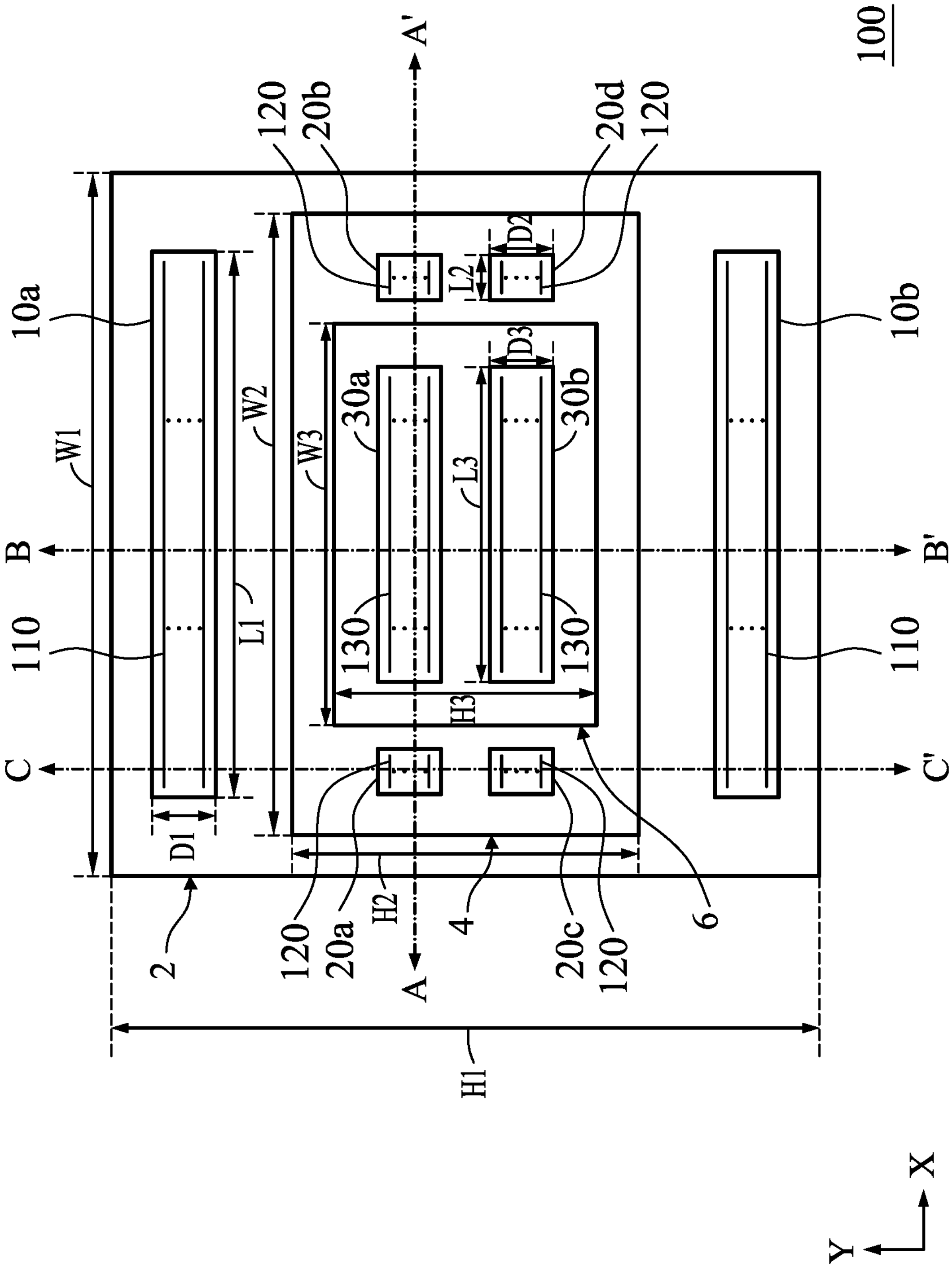
FIG. 1 shows a top view of a bipolar junction transistor (BJT) according to some embodiments of the invention.

FIG. 1 shows a top view of a bipolar junction transistor (BJT) 100 according to some embodiments of the invention. The BJT 100 is a PNP BJT device and includes a collector region 2, a base region 4 and an emitter region 6. The emitter region 6 has a width W3 in the X direction and a height H3 in the Y direction. The emitter region 6 is surrounded by the base region 4. The base region 4 is a ring area having an inner boundary and an outer boundary. The inner boundary of the base region 4 has the width W3 in the X direction and the height H3 in the Y direction, and the outer boundary of the base region 4 has a width W2 in the X direction and a height H2 in the Y direction. The width W2 is greater than the width W3 (i.e., W2>W3), and the height H2 is greater than the height H3 (i.e., H2>H3). The base region 4 is surrounded by the collector region 2. The collector region 2 is a ring area having an inner boundary and an outer boundary. The inner boundary of the collector region 2 has the width W2 in the X direction and the height H2 in the Y direction, and the outer boundary of the collector region 2 has a width W1 in the X direction and a height H1 in the Y direction. The width W1 is greater than the width W2 (i.e., W1>W2), and the height H1 is greater than the height H2 (i.e., H1>H2).

In FIG. 1, the collector region 2 includes two active regions 10*a* and 10*b*. In the Y direction, the active regions 10*a* and 10*b* are disposed on two opposite sides of the base region 4. The active regions 10*a* and 10*b* has a length L1 in the X direction and a width D1 in the Y direction. In the embodiment, the length L1 is greater than the width W3 and less than the width W2, i.e., W2>L1>W3. Each of the active regions 10*a* and 10*b* includes a plurality of P-type transistors, and the P-type transistors are formed by the fins 110 extending in the X direction. Furthermore, there are the same number of fins 110 in active regions 10*a* and 10*b*. In order to simplify the description, the gate structures of the P-type transistors corresponding to the fins 110 are omitted in FIG. 1. The gate structures of the P-type transistors extend in the Y direction, and the gate structures of the P-type transistors are floating, i.e., no signal is applied to the gate of the P-type transistors.

The base region 4 includes fourth active regions 20*a*, 20*b*, 20*c* and 20*d*. In the Y direction, the active regions 20*b* and 20*d* and the active regions 20*a* and 20*c* are disposed on two opposite sides of the emitter region 6. The active regions 20*a*, 20*b*, 20*c* and 20*d* have a length L2 in the X direction and a width D2 in the Y direction. Each of the active regions 20*a*, 20*b*, 20*c* and 20*d* includes a plurality of N-type transistors, and the N-type transistors are formed by the fins 120 extending in the X direction. Furthermore, there are the same number of fins 120 in active regions 20*a*, 20*b*, 20*c* and 20*d*. In the BJT 100, the fins 120 are shorter than the fins 110. Furthermore, there are fewer fins 120 in each of active regions 20*a*, 20*b*, 20*c* and 20*d* than the fins 110 in each of active regions 10*a* and 10*b*. In order to simplify the description, the gate structures of the N-type transistors are omitted in FIG. 1. The gate structures of the N-type transistors extend in the Y direction, and the gate structures of the N-type transistors are floating, i.e., no signal is applied to the gate of the N-type transistors.

The emitter region 6 includes two active regions 30*a* and 30*b*. The active regions 30*a* and 30*b* has a length L3 in the X direction and a width D3 in the Y direction. In the embodiment, the length L3 is greater than the length L2 and less than the length L1, i.e., L1>L3>W2. In some embodiments, the width D3 is equal to the width D2, i.e., D2=D3. In some embodiments, the width D3 is greater than the width D2, i.e., D3>D2. Each of the active regions 30*a* and 30*b* includes a plurality of P-type transistors, and the P-type transistors are formed by the fins 130 extending in the X direction. Furthermore, there are the same number of fins 130 in active regions 30*a* and 30*b*. In the BJT 100, the fins 130 are shorter than the fins 110 and longer than the fins 120. Furthermore, the number of the fins 130 in each of the active regions 30*a* and 30*b* is greater than the number of the fins 120 in each of the active regions 20*a*, 20*b*, 20*c* and 20*d*. In order to simplify the description, the gate structures of the P-type transistors corresponding to the fins 130 and extending in the Y direction are omitted in FIG. 1. The gate structures of the P-type transistors extend in the Y direction, and the gate structures of the P-type transistors are floating, i.e., no signal is applied to the gate of the P-type transistors.

The active region 30*a* is close to the active region 10*a* (i.e., away from the active region 10*b*), and the active region 30*b* is close to the active region 10*b* (i.e., away from the active region 10*a*). In other words, the active region 30*a* is arranged between the active region 30*b* and the active region 10*a*, and the active region 30*b* is arranged between the active region 30*a* and the active region 10*b*. Moreover, the active region 20*a* and 20*b* are close to the active region 10*a* (i.e., away from the active region 10*b*), and the active regions 20*c* and 20*d* are close to the active region 10*b* (i.e., away from the active region 10*a*). In other words, the active region 20*a* is arranged between the active region 20*c* and the active region 10*a*, and the active region 20*b* is arranged between the active region 20*d* and the active region 10*a*. The active region 20*c* is arranged between the active region 20*a* and the active region 10*b*, and the active region 20*d* is arranged between the active region 20*b* and the active region 10*b*.

In the BJT 100, the active regions 30*a* and 30*b* are disposed between the active regions 20*a*, 20*b*, 20*c* and 20*d*. Moreover, the active regions 30*a* and 30*b* and the active regions 20*a*, 20*b*, 20*c* and 20*d* are disposed between the active regions 10*a* and 10*b*. In the embodiment, the number of the active regions 30*a* and 30*b* is equal to the number of the active regions 10*a* and 10*b*. The number of the active regions 20*a*, 20*b*, 20*c* and 20*d* is greater than to the number of the active regions 10*a* and 10*b*. For example, the number of the active regions 20*a*, 20*b*, 20*c* and 20*d* is the sum of the number of the active regions 10*a* and 10*b* and the number of the active regions 30*a* and 30*b*.

In the BJT 100, the transistors formed in the active regions of the collector region 2, the base region 4 and the emitter region 6 are regular fin-base transistors. In some embodiments, the transistors in the active regions of the BJT 100 may be planar transistors, non-regular fin field effect transistors (FinFETs) (e.g., the fins with various widths), vertical gate all around (GAA), horizontal GAA, nano wire, nano sheet, or a combination thereof.

In the BJT 100, the active regions 20*a* and 20*b* are respectively disposed on the left and right sides of the active region 30*a*, and the active regions 20*a* and 20*b* and the active region 30*a* are arranged on a straight line in the X direction. Moreover, the active regions 20*c* and 20*d* are respectively disposed on the left and right sides of the active region 30*b*, and the active regions 20*c* and 20*d* and the active region 30*b* are arranged on a straight line in the X direction. In other words, no active region of the base region 4 is disposed between the active regions 10*a* and 10*b* of the collector region 2 and the active regions 30*a* and 30*b* of the emitter region 6. Moreover, the active regions 20*a* and 20*c* are arranged on a straight line in the Y direction, and the active regions 20*b* and 20*d* are arranged on a straight line in the Y direction.

The distance between the active region 20*a* and the active region 10*a* is equal to the distance between the active region 20*b* and the active region 10*a*, and the distance between the active region 20*c* and the active region 10*b* is equal to the distance between the active region 20*d* and the active region 10*b*. In some embodiments, the distance between the active region 20*a* (or 20*b*) and the active region 10*a* is equal to the distance between the active region 30*a* and the active region 10*a*. Similarly, the distance between the active region 20*c* (or 20*d*) and the active region 10*b* is equal to the distance between the active region 30*b* and the active region 10*b*. In some embodiments, the active regions 30*a* and 30*b* may be merged into one active region, the active regions 20*a* and 20*c* may be merged into one active region, and the active regions 20*b* and 20*d* may be merged into one active region.

Figure 2:
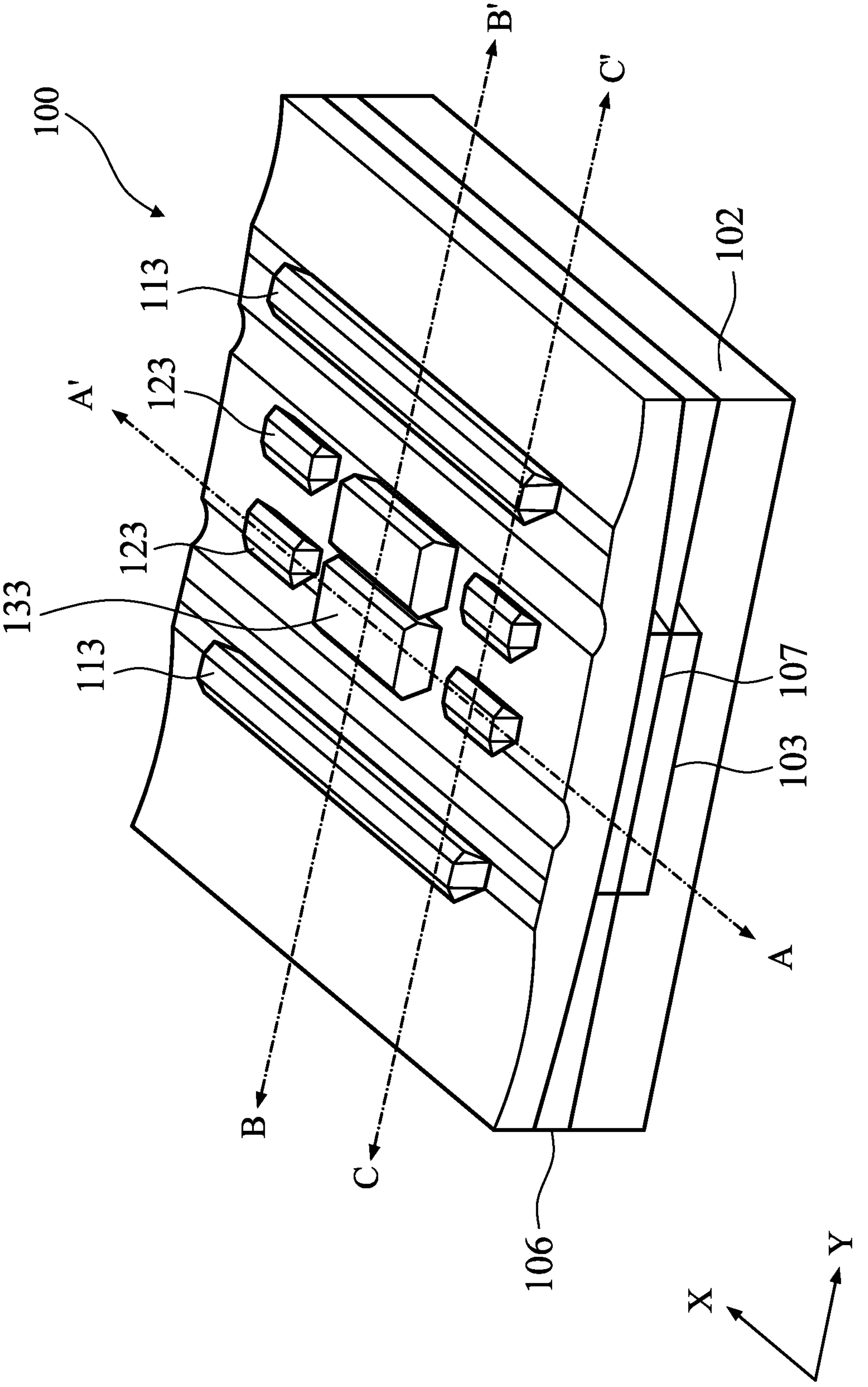
FIG. 2 shows a perspective view of the BJT of FIG. 1 according to some embodiments of the invention.

FIG. 2 shows a perspective view of the BJT 100 of FIG. 1 according to some embodiments of the invention. The BJT 100 is formed over the semiconductor substrate 102. In some embodiments, the semiconductor substrate 102 is a Si substrate. In some embodiments, the material of the semiconductor substrate 102 is selected from a group consisting of bulk-Si, SiP, SiGe, SiC, SiPC, Ge, SOI—Si, SOI—SiGe, III-VI material, or a combination thereof.

In FIG. 2, the deep N-type well region 103 is formed in the semiconductor substrate 102. The N-type well region 107 is formed over the deep N-type well 103. Furthermore, the P-type well region 106 is formed over the semiconductor substrate 102. The source/drain features 113 are epitaxially grown on the fins 110, and the collector region 2 of the BJT 100 is electrically coupled to the upper interconnect structure (not shown) through the source/drain features 113. The source/drain features 123 are epitaxially grown on the fins 120, and the base region 4 of the BJT 100 is electrically coupled to the upper interconnect structure (not shown) through the source/drain features 123. The source/drain features 133 are epitaxially grown on the fins 130, and the emitter region 6 of the BJT 100 is electrically coupled to upper the interconnect structure (not shown) through the source/drain features 133.

There are two basic types of bipolar transistor structures, PNP and NPN, which basically describe the physical arrangement of the P-type and N-type semiconductor materials from which they are made. In the embodiment, the BJT 100 is the PNP-type BJT device. In some embodiments, the BJT 100 may be the NPN-type BJT device by modifying the semiconductor materials and adding the required semiconductor layer.

Figure 3A:
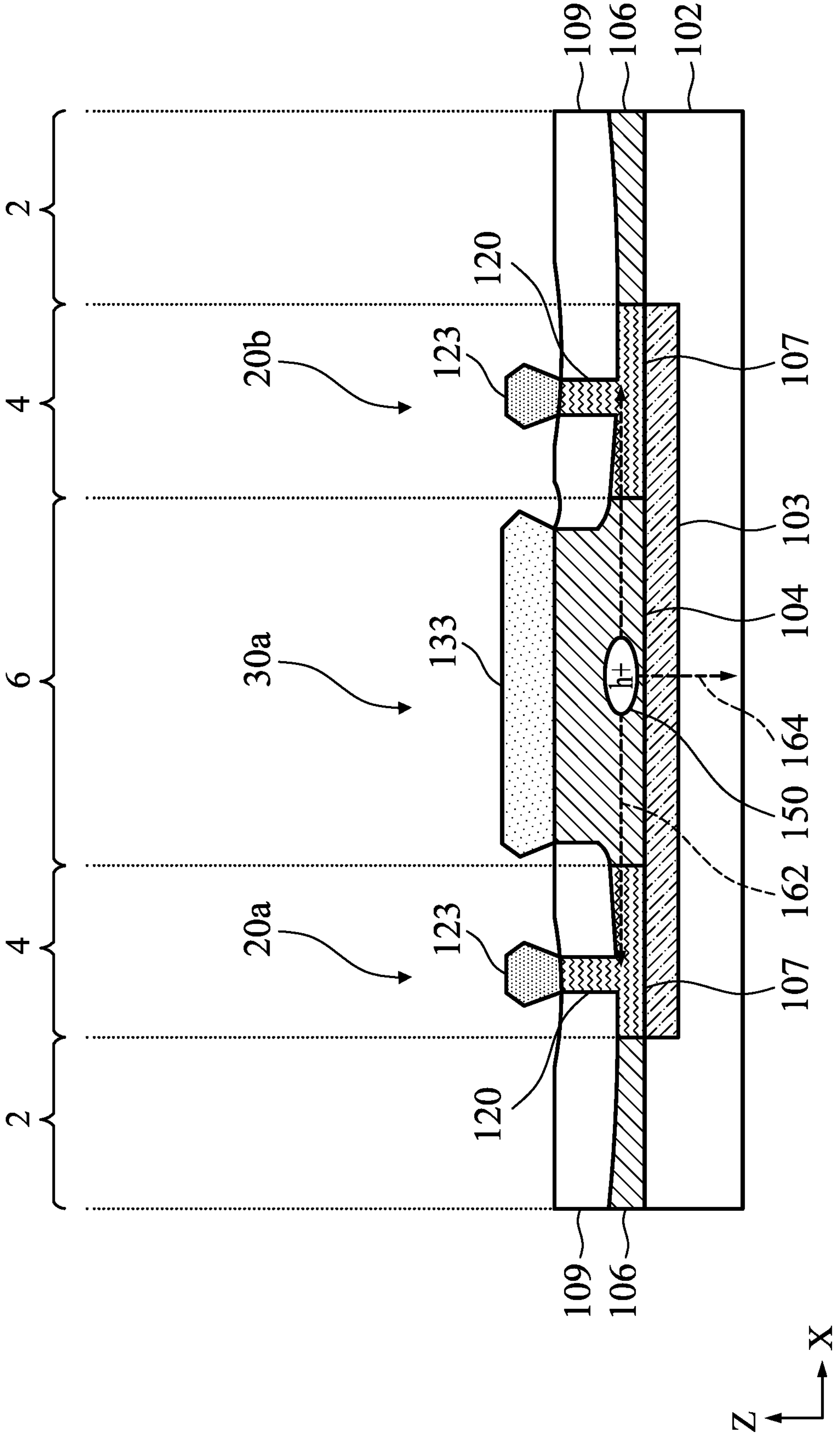
FIG. 3A shows a cross-sectional view of the semiconductor structure of the BJT along line A-A' of FIG. 1 and FIG. 2 according to some embodiments of the invention.

FIG. 3A shows a cross-sectional view of the semiconductor structure of the BJT 100 along line A-A' of FIG. 1 and FIG. 2 according to some embodiments of the invention. The deep N-type well region 103 is formed in the semiconductor substrate 102. Furthermore, the top surfaces of the deep N-type well region 103 and the semiconductor substrate 102 are coplanar.

The P-type well region 104 is formed over the deep N-type well region 103, and the fin 130 is formed over the P-type well region 104. The P-type well region 104 overlaps the deep N-type well region 103 in the Z direction. The fin 130 extends in the X direction. The source/drain feature 133 is epitaxially grown on the fin 130, and extends in the X direction. In some embodiments, the source/drain feature 133 and the fin 130 are substantially have the same length in the X direction.

The N-type well region 107 is formed over the deep N-type well region 103, and the fins 120 are formed over the N-type well region 107. The N-type well region 107 overlaps the deep N-type well region 103 in the Z direction. The fins 120 extend in the X direction. As described above, the fin 120 is shorter than the fin 130 in the X direction. The source/drain feature 123 is epitaxially grown on the fin 120, and extends in the X direction. In some embodiments, the source/drain feature 123 and the fin 120 are substantially have the same length in the X direction.

The fins 120 are separated from each other by the STI 109, and the fins 130 are separated from each other by the STI 109. The P-type well region 104 is surrounded by the N-type well region 107. The P-type well region 104 is separated from the P-type well region 106 by the N-type well region 107. Furthermore, the P-type well region 104 and the N-type well region 107 are separated from the semiconductor substrate 102 by the deep N-type well region 103.

When the BJT 100 is operated, a signal (voltage or current) is applied to the emitter region 6 through the source/drain feature 133. In FIG. 3A, label 162 represents the path of the electric holes 150 transported from the source/drain feature 133 and the fin 130 of the emitter region 6 to the source/drain feature 123 and the fins 120 of the base region 4. Moreover, label 164 represents the path of the electric holes 150 transported from the source/drain feature 133 and the fin 130 of the emitter region 6 to the semiconductor substrate 102.

In the BJT 100, the collector region 2 is defined by the P-type well region 106, and the P-type well region 106 is a ring-shaped well region in the layout. Moreover, the base region 4 is defined by the N-type well region 107, and the N-type well region 107 is a ring-shaped well region in the layout. The emitter region is defined by the P-type well region 104, and the P-type well region 104 is a rectangular well region in the layout. In some embodiments, the P-type well regions 104 and 106 and the N-type well region 107 are formed in the same layer. Furthermore, the P-type well region 104 is surrounded by the N-type well region 107, and the N-type well region 107 is surrounded by the P-type well region 106.

Figure 3B:
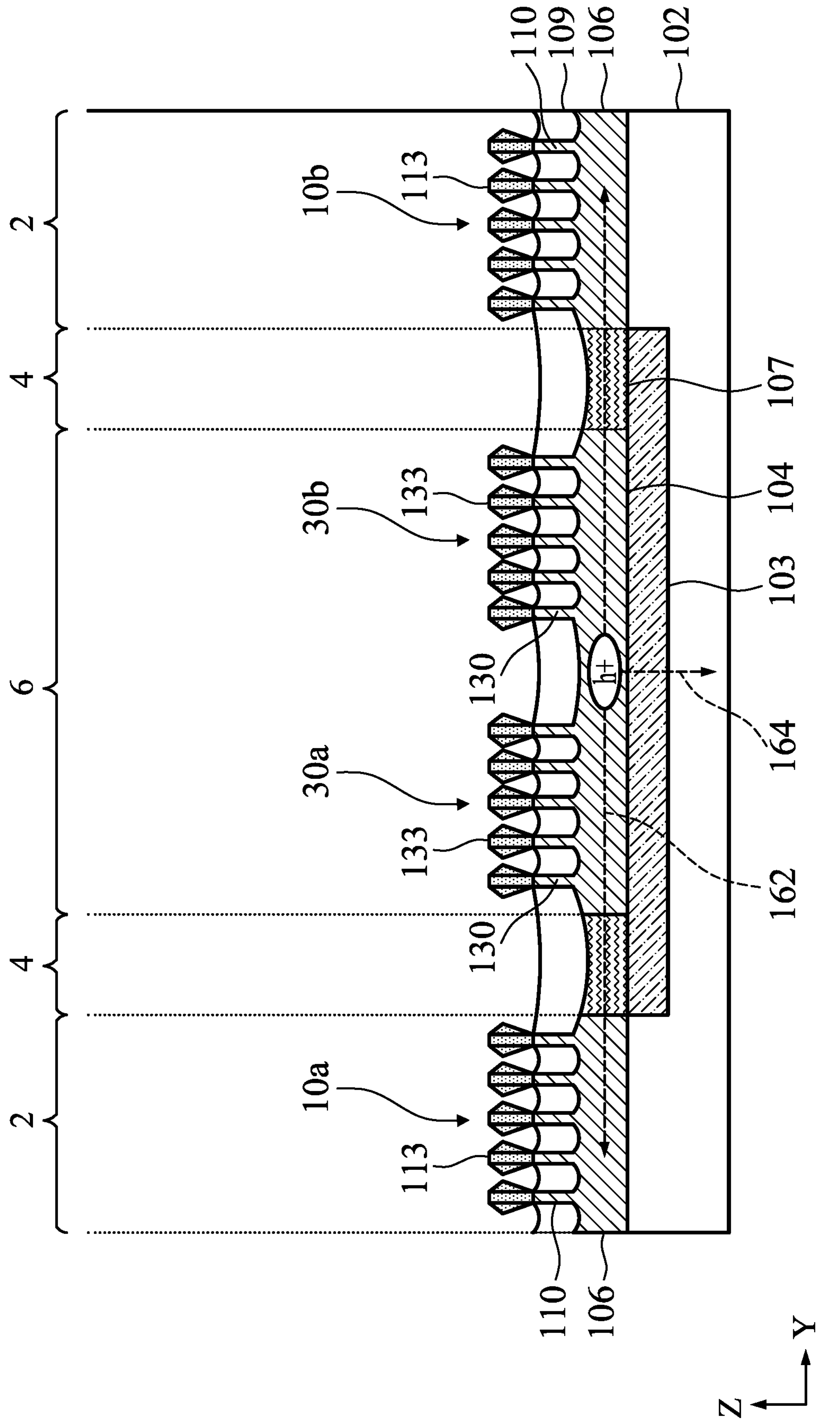
FIG. 3B shows a cross-sectional view of the semiconductor structure of the BJT along line B-B' of FIG. 1 and FIG. 2 according to some embodiments of the invention.

FIG. 3B shows a cross-sectional view of the semiconductor structure of the BJT 100 along line B-B' of FIG. 1 and FIG. 2 according to some embodiments of the invention. The deep N-type well region 103 is formed in the semiconductor substrate 102. The P-type well region 104 and the N-type well region 107 overlap the deep N-type well region 103. The P-type well region 106 does not overlap the deep N-type well region 103. Furthermore, the P-type well region 104 is separated from the P-type well region 106 by the N-type well region 107.

In FIG. 3B, the fins 130 of the active regions 30*a* and 30*b* are formed over the P-type well region 104, and the fins 130 are separated from each other by the STI 109. The source/drain features 133 are epitaxially grown on the fins 130. In order to simplify the description, the floating gate structures between the source/drain feature 133 in the active regions 30*a* and 30*b* are omitted in FIG. 3B. The fins 110 of the active regions 10*a* and 10*b* are formed over the P-type well region 106, and the fins 110 are separated from each other by the STI 109. The source/drain features 113 are epitaxially grown on the fins 110. In order to simplify the description, the floating gate structures between the source/drain feature 113 in the active regions 10*a* and 10*b* are omitted in FIG. 3B. In some embodiments, the number of the fins 130 in each of the active regions 30*a* and 30*b* is equal to the number of the fins 110 in each of the active regions 10*a* and 10*b*. It should be noted that the N-type well region 107 between the active regions 10*a* and 30*a* and the N-type well region 107 between the active regions 10*b* and 30*b* do not have fins 120 in the base region 4 (i.e., the active region of the base region 4).

Compared with traditional BJT device, no active region of the base region 4 is disposed between the active region 30*a*/30*b* of the emitter region 6 and the active region 10*a*/10*b* of the collector region 2. Therefore, the BJT 100 has high base resistance than the traditional BJT device. When the BJT 100 is operated, the electric holes 150 are transported from the source/drain feature 133 and the fin 130 of the emitter region 6 to the source/drain feature 113 and the fins 110 of the collector region 2, and not a huge amount is lost since no fins 120 exists between the fins 110 and fins 130. Although the electric holes 150 still need to pass through the base region 4 and has recombination, the electric holes 150 do not directly affected by the active region (e.g., the active region 20*a*, 20*b*, 20*c* or 20*d*) of the base region 4. Therefore, the electric holes 150 have high possibility to arrive in the collector region 2 for high beta achievement.

Figure 3C:
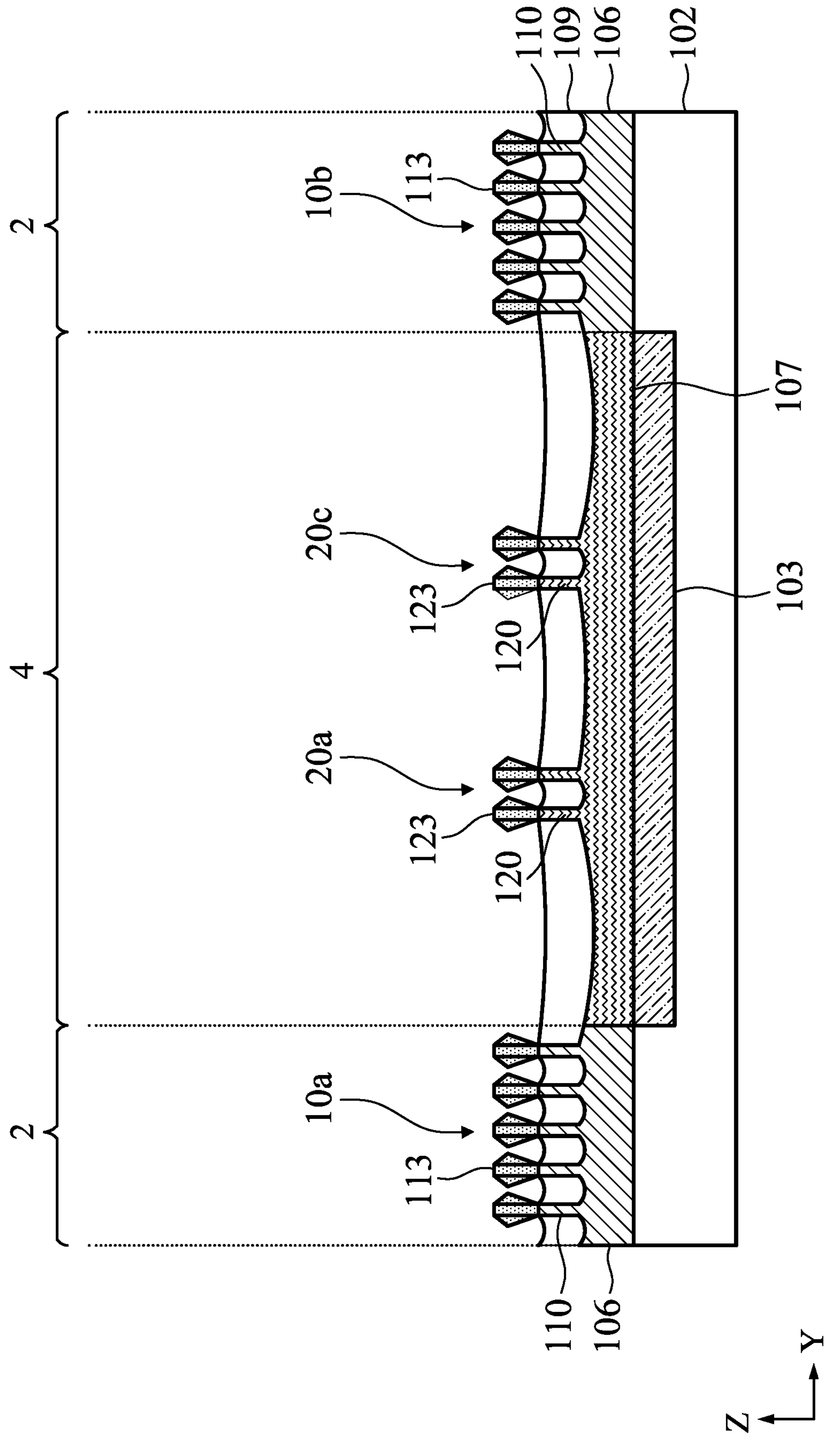
FIG. 3C shows a cross-sectional view of the semiconductor structure of the BJT along line C-C' of FIG. 1 and FIG. 2 according to some embodiments of the invention.

FIG. 3C shows a cross-sectional view of the semiconductor structure of the BJT 100 along line C-C' of FIG. 1 and FIG. 2 according to some embodiments of the invention. The deep N-type well region 103 is formed in the semiconductor substrate 102. The N-type well region 107 is formed over the deep N-type well region 103 and overlaps the deep N-type well region 103 in the Z direction. The P-type well region 106 is formed over the semiconductor substrate 102 and does not overlap the deep N-type well region 103 in the Z direction.

In FIG. 3C, the fins 120 of the active regions 20*a* and 20*c* are formed over the N-type well region 107, and the fins 120 are separated from each other by the STI 109. The source/drain feature 123 is epitaxially grown on the fins 120. In order to simplify the description, the floating gate structures between the source/drain feature 123 in the active regions 20*a* and 20*c* are omitted in FIG. 3C. The fins 110 of the active regions 10*a* and 10*b* are formed over the P-type well region 106, and the fins 110 are separated from each other by the STI 109. The source/drain feature 113 is epitaxially grown on the fins 110. In order to simplify the description, the floating gate structures between the source/drain feature 113 in the active regions 10*a* and 10*b* are omitted in FIG. 3C. In some embodiments, the number of the fins 120 in each of the active regions 20*a* and 20*c* is less than the number of the fins 110 in each of the active regions 10*a* and 10*b*.

Figure 4:
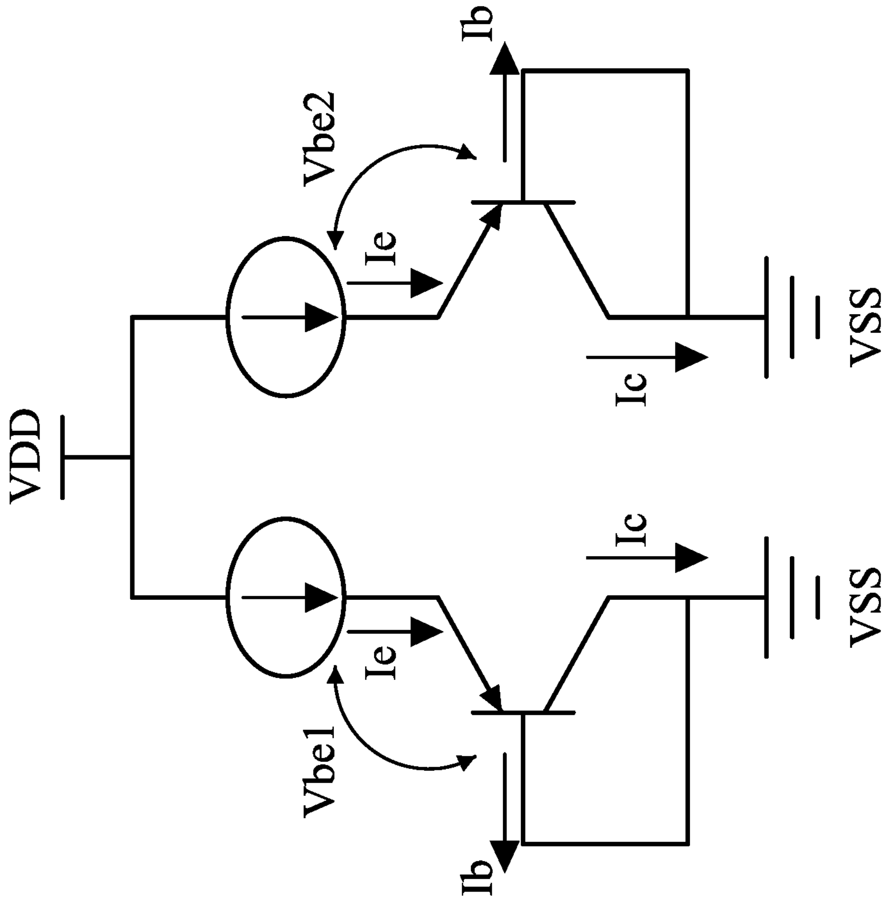
FIG. 4 shows an equivalent circuit of the BJT according to some embodiments of the invention.

FIG. 4 shows an equivalent circuit of the BJT 100 according to some embodiments of the invention. A current source is configured to provide the current Ie to the BJT 100, and Ie=Ic+Ib. The current Ic is the current flowing out of the collector terminal, the current Ib is the current flowing out of the base terminal, and the current Ie is the current flowing into the emitter terminal. The current Ib of the BJT 100 is less than that of the traditional BJT device because no active region of the base region is disposed between the active regions of the emitter region and the active regions of the collector region in the BJT 100 (i.e., the base region has high base resistance). Therefore, the current Ic of the BJT 100 is greater than that of the traditional BJT device for the same current Ie, and the BJT 100 has high beta gain βf (βf=Ic/Ib) than the traditional BJT device. Low base current noise may cause the voltage difference Vbe between the emitter terminal and the collector terminal less variation. Therefore, the mismatch voltage difference ΔVbe (ΔVbe=Vbe1−Vbe2) is decrease for the BJT 100.

Figure 5:
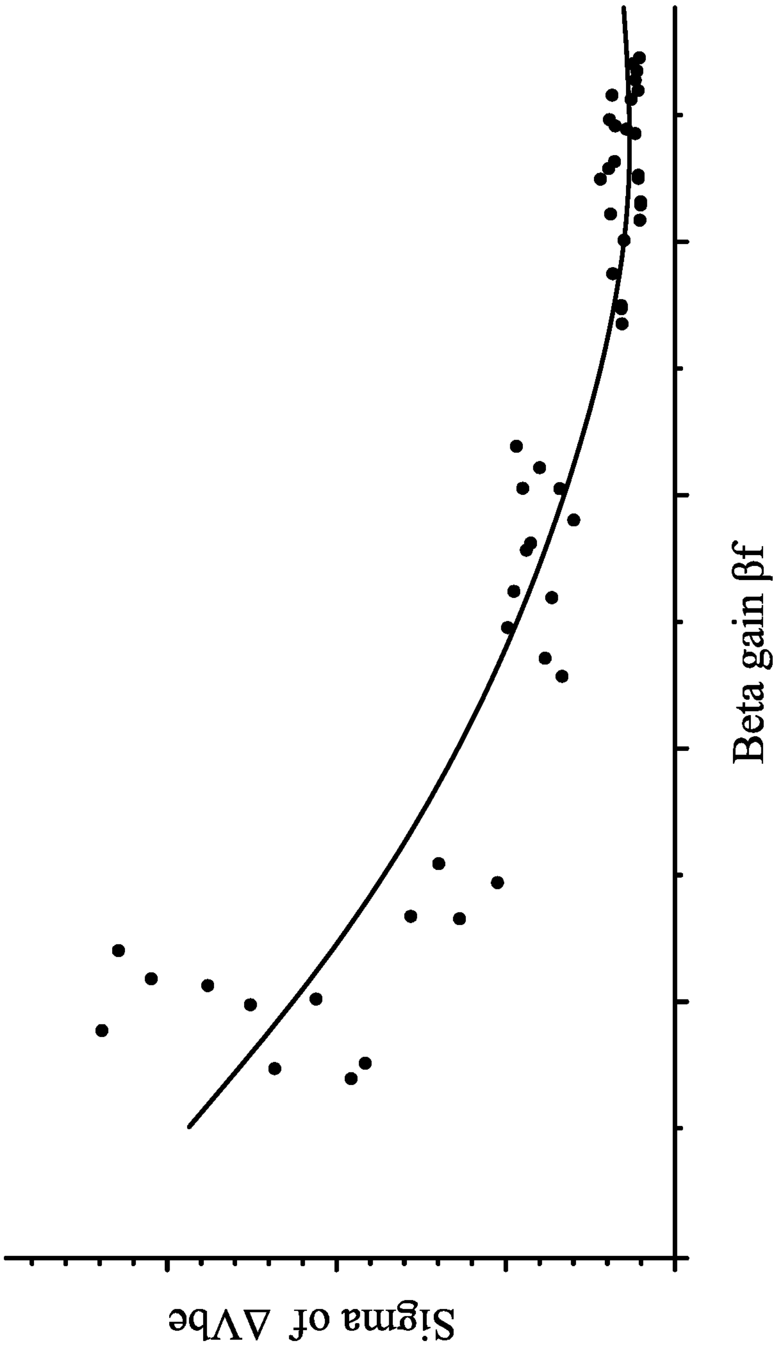
FIG. 5 shows the relationship between the beta gain and the sigma of the mismatch voltage difference.

FIG. 5 shows the relationship between the beta gain βf and the sigma of the mismatch voltage difference ΔVbe. As shown in FIG. 5, when the beta gain βf is increased, the sigma of the mismatch voltage difference ΔVbe is decreased. The BJT 100 having low mismatch may improve thermal sensor accuracy.

Figure 6:
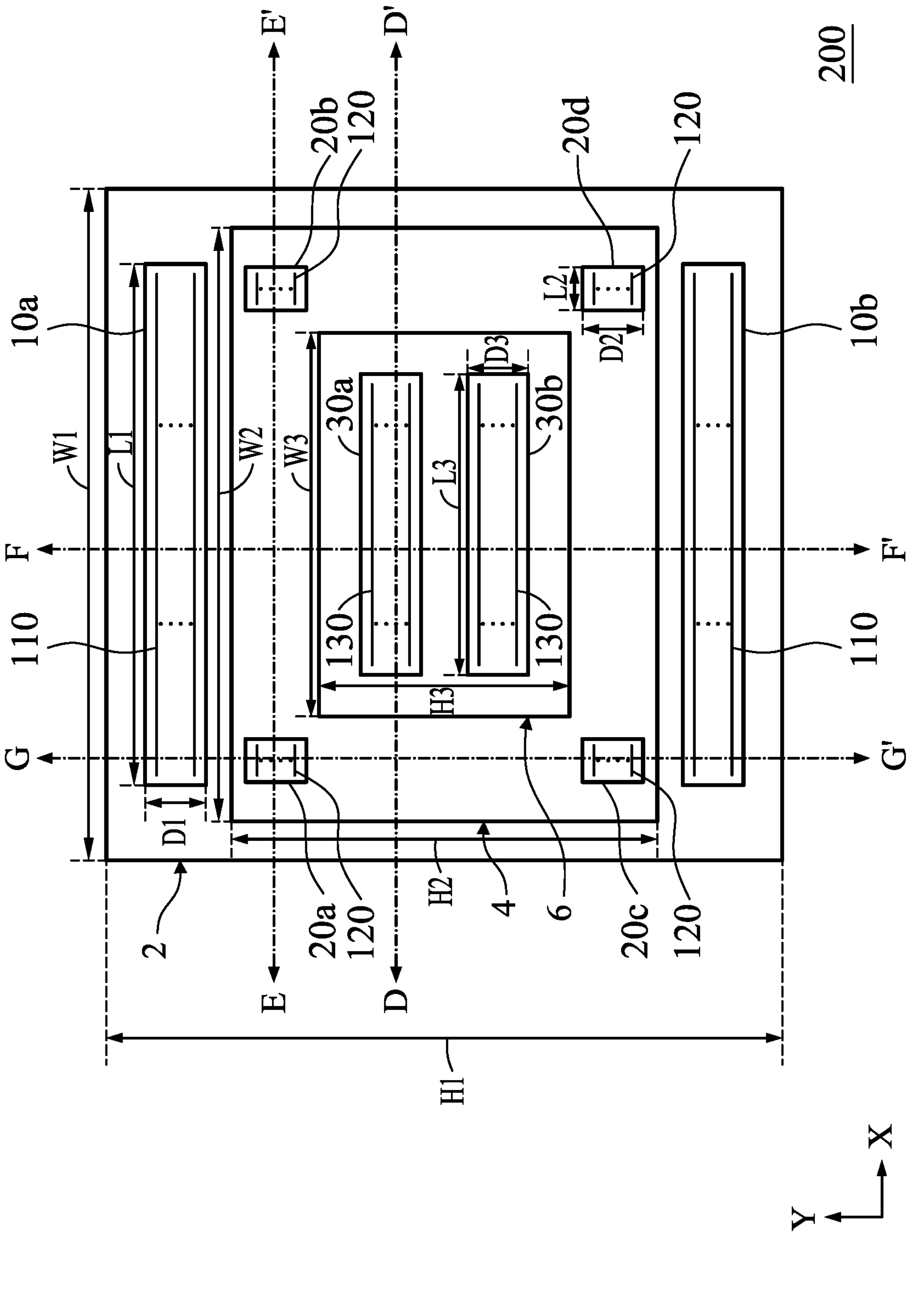
FIG. 6 shows a top view of a BJT according to some embodiments of the invention.

FIG. 6 shows a top view of a BJT 200 according to some embodiments of the invention. The BJT 200 includes a collector region 2, a base region 4 and an emitter region 6. The configuration of the BJT 200 is similar to that of the BJT 100 of FIG. 1. The difference between the BJT 200 of FIG. 6 and the BJT 100 of FIG. 1 is that the active regions 20*a*, 20*b*, 20*c* and 20*d* of the BJT 200 in FIG. 6 are disposed in four corners of the base region 4. For example, the active regions 20*a*, 20*b*, 20*c* and 20*d* are arranged in the upper left corner, the upper right corner, the lower left corner and the lower right corner of the base region 4, respectively. In other words, the active regions 20*a* and 20*b* and the active region 30*a* are not arranged on a straight line in the X direction, and the active regions 20*c* and 20*d* and the active region 30*b* are not arranged on a straight line in the X direction. Moreover, the active regions 20*a* and 20*c* are arranged on a straight line in the Y direction, and the active regions 20*b* and 20*d* are arranged on a straight line in the Y direction.

In the BJT 200, no active region of the base region 4 is disposed between the active regions 10*a* and 10*b* of the collector region 2 and the active regions 30*a* and 30*b* of the emitter region 6. In some embodiments, the distance between the active region 20*a* (or 20*b*) and the active region 10*a* is less than the distance between the active region 30*a* and the active region 10*a*. Similarly, the distance between the active region 20*c* (or 20*d*) and the active region 10*b* is less than the distance between the active region 30*b* and the active region 10*b*. In some embodiments, the active regions 30*a* and 30*b* may be merged into one active region.

Figure 7:
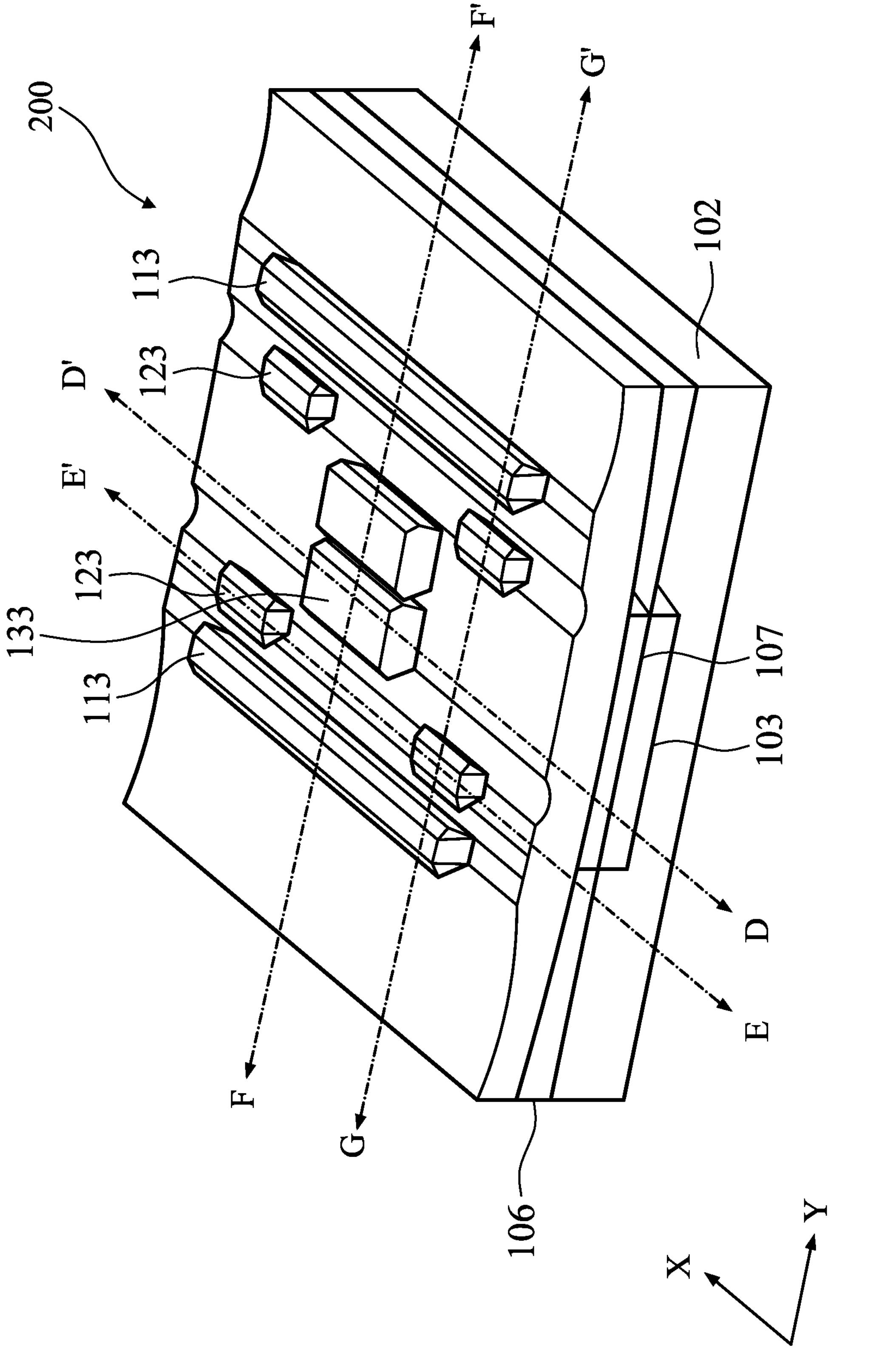
FIG. 7 shows a perspective view of the BJT of FIG. 6 according to some embodiments of the invention.

FIG. 7 shows a perspective view of the BJT 200 of FIG. 6 according to some embodiments of the invention. The BJT 200 is formed over the semiconductor substrate 102. The deep N-type well region 103 is formed in the semiconductor substrate 102. The N-type well region 107 is formed over the deep N-type well 103. Furthermore, the P-type well region 106 is formed over the semiconductor substrate 102. The source/drain features 113 are epitaxially grown on the fins 110 for connecting the collector region 2 of the BJT 200 to the upper interconnect structure (not shown). The source/drain features 123 are epitaxially grown on the fins 120 for connecting the base region 4 of the BJT 200 to the upper interconnect structure (not shown). The source/drain features 133 are epitaxially grown on the fins 130 for connecting the emitter region 6 of the BJT 200 to the upper interconnect structure (not shown).

Figure 8A:
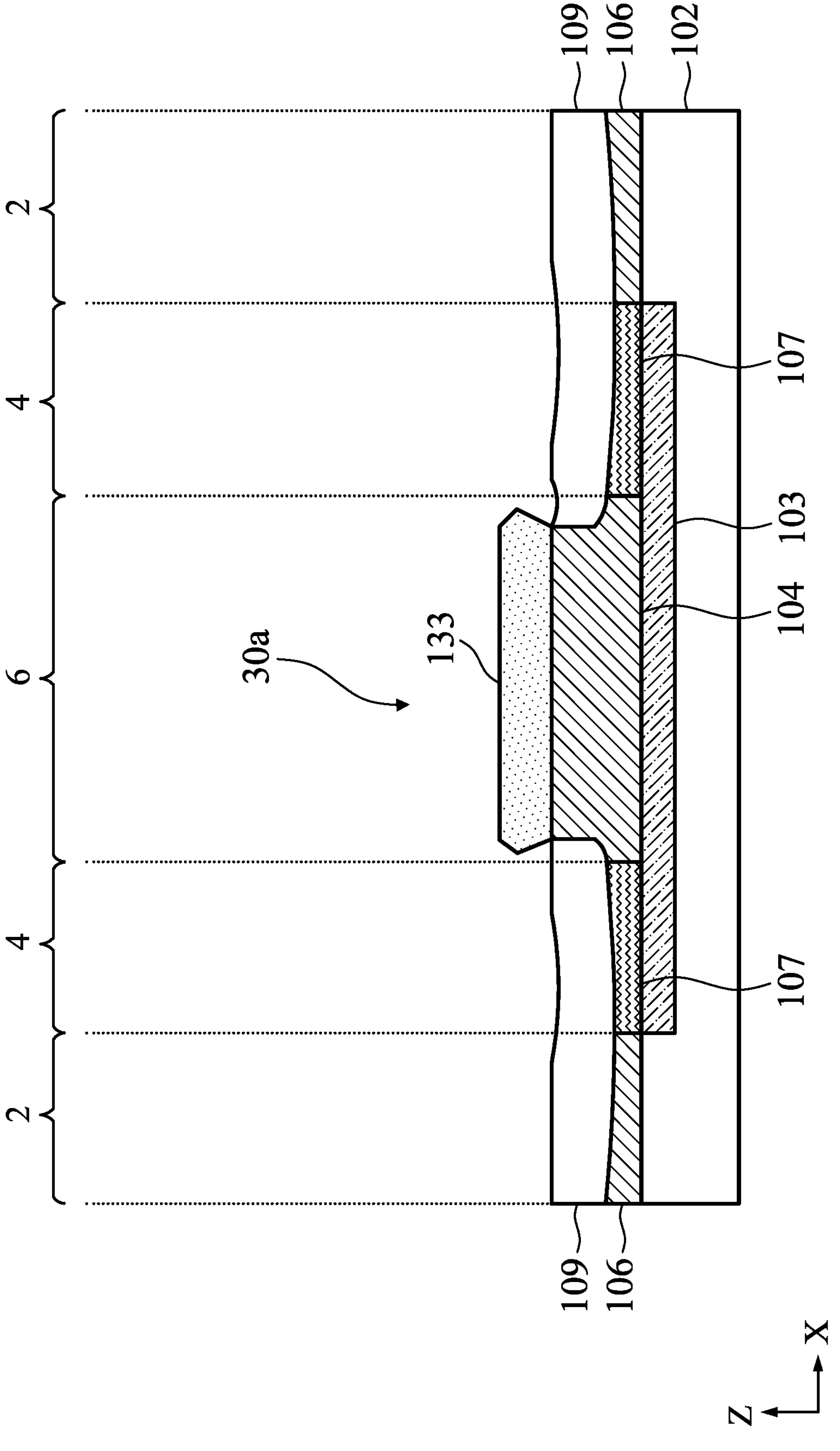
FIG. 8A shows a cross-sectional view of the semiconductor structure of the BJT along line D-D' of FIG. 6 and FIG. 7 according to some embodiments of the invention.

FIG. 8A shows a cross-sectional view of the semiconductor structure of the BJT 200 along line D-D' of FIG. 6 and FIG. 7 according to some embodiments of the invention. The deep N-type well region 103 is formed in the semiconductor substrate 102. Furthermore, the top surfaces of the deep N-type well region 103 and the semiconductor substrate 102 are coplanar.

The P-type well region 104 is formed over the deep N-type well region 103, and the fin 130 is formed over the P-type well region 104. The P-type well region 104 overlaps the deep N-type well region 103 in the Z direction. The fin 130 extends in the X direction. The source/drain feature 133 is epitaxially grown on the fin 130, and extends in the X direction. In some embodiments, the source/drain feature 133 and the fin 130 are substantially have the same length in the X direction.

The N-type well region 107 is formed over the deep N-type well region 103 and overlaps the deep N-type well region 103 in the Z direction. The P-type well region 104 is surrounded by the N-type well region 107, and the P-type well region 104 is separated from the P-type well region 106 by the N-type well region 107.

In the BJT 200, the collector region 2 is defined by the P-type well region 106, and the P-type well region 106 is a ring-shaped well region in the layout. Moreover, the base region 4 is defined by the N-type well region 107, and the N-type well region 107 is a ring-shaped well region in the layout. The emitter region is defined by the P-type well region 104, and the P-type well region 104 is a rectangular well region in the layout. In some embodiments, the P-type well regions 104 and 106 and the N-type well region 107 are formed in the same layer. Furthermore, the P-type well region 104 is surrounded by the N-type well region 107, and the N-type well region 107 is surrounded by the P-type well region 106.

Figure 8B:
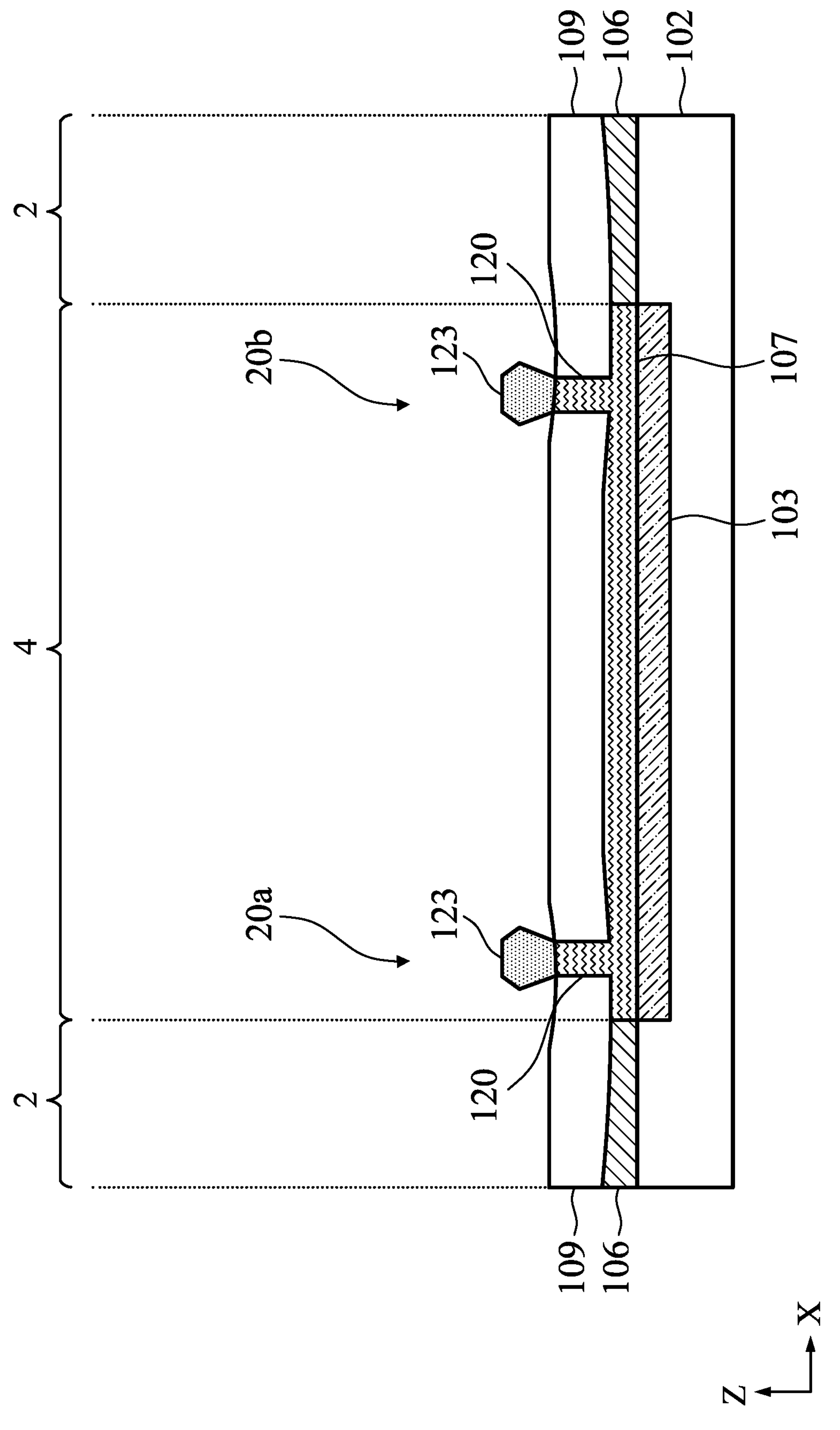
FIG. 8B shows a cross-sectional view of the semiconductor structure of the BJT along line E-E' of FIG. 6 and FIG. 7 according to some embodiments of the invention.

FIG. 8B shows a cross-sectional view of the semiconductor structure of the BJT 200 along line E-E' of FIG. 6 and FIG. 7 according to some embodiments of the invention. The deep N-type well region 103 is formed in the semiconductor substrate 102. The N-type well region 107 is formed over the deep N-type well region 103, and the fin 120 is formed over the N-type well region 107. The N-type well region 107 overlaps the deep N-type well region 103 in the Z direction. The fin 120 extends in the X direction. The source/drain feature 123 is epitaxially grown on the fin 120, and extends in the X direction. In some embodiments, the source/drain feature 123 and the fin 120 are substantially have the same length in the X direction.

Figure 8C:
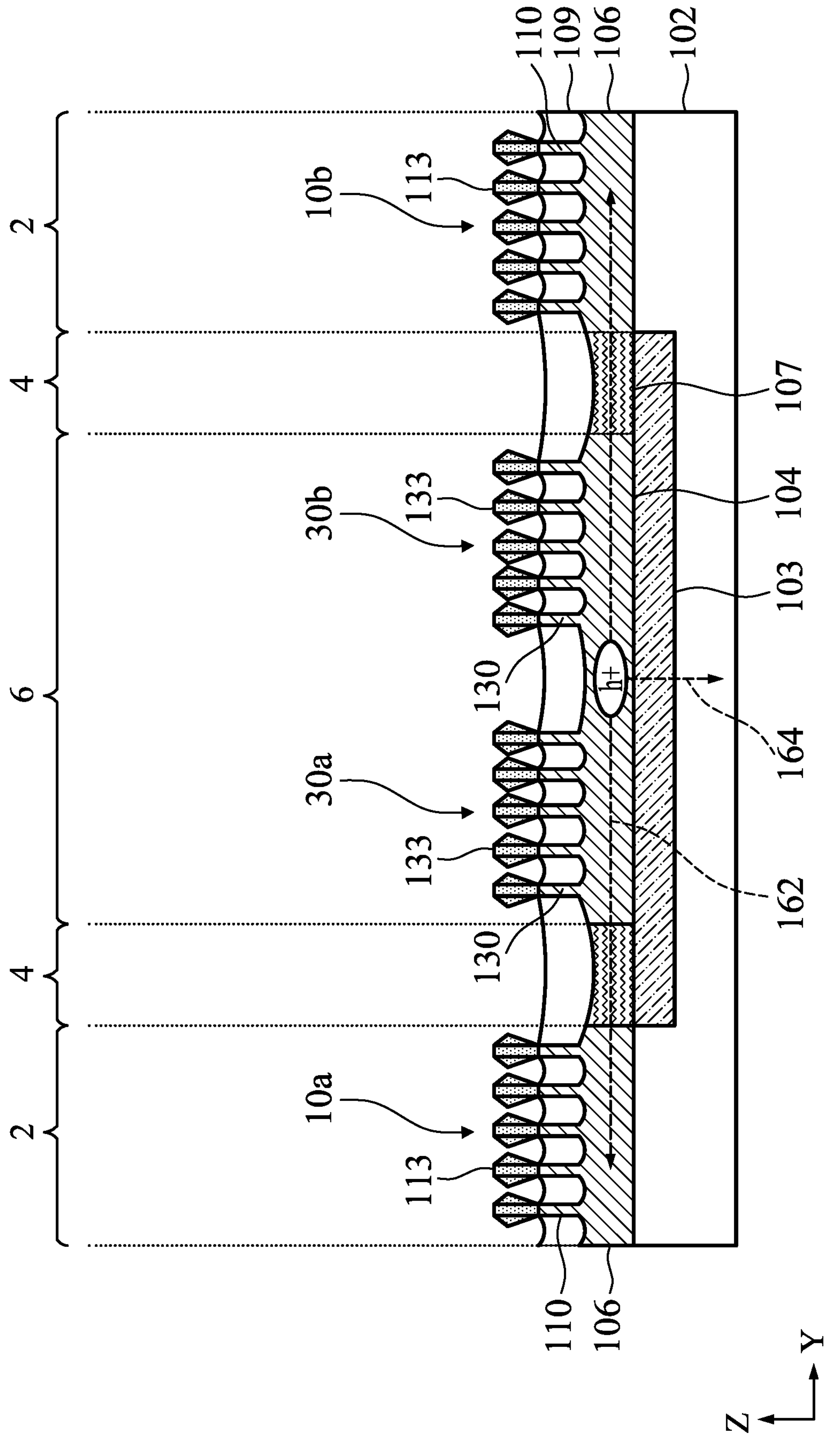
FIG. 8C shows a cross-sectional view of the semiconductor structure of the BJT along line F-F' of FIG. 6 and FIG. 7 according to some embodiments of the invention.

FIG. 8C shows a cross-sectional view of the semiconductor structure of the BJT 200 along line F-F' of FIG. 6 and FIG. 7 according to some embodiments of the invention. The deep N-type well region 103 is formed in the semiconductor substrate 102. The P-type well region 104 overlaps the deep N-type well region 103. The P-type well region 104 and the N-type well region 107 overlap the deep N-type well region 103. The P-type well region 106 does not overlap the deep N-type well region 103. Furthermore, the P-type well region 104 is separated from the P-type well region 106 by the N-type well region 107.

In FIG. 8C, the fins 130 of the active regions 30*a* and 30*b* are formed over the P-type well region 104, and the fins 130 are separated from each other by the STI 109. The source/drain features 133 are epitaxially grown on the fins 130. In order to simplify the description, the floating gate structures between the source/drain feature 133 in the active regions 30*a* and 30*b* are omitted in FIG. 8C. The fins 110 of the active regions 10*a* and 10*b* are formed over the P-type well region 106, and the fins 110 are separated from each other by the STI 109. The source/drain features 113 are epitaxially grown on the fins 110. In order to simplify the description, the floating gate structures between the source/drain feature 113 in the active regions 10*a* and 10*b* are omitted in FIG. 8C. In some embodiments, the number of the fins 130 in the active regions 30*a* and 30*b* is equal to the number of the fins 110 in the active regions 10*a* and 10*b*. It should be noted that the N-type well region 107 between the active regions 10*a* and 30*a* and the N-type well region 107 between the active regions 10*b* and 30*b* do not have the fins 120 in the base region 4 (i.e., the active region of the base region 4).

Compared with traditional BJT device, no active region of the base region 4 is disposed between the active region 30*a*/30*b* of the emitter region 6 and the active region 10*a*/10*b* of the collector region 2. Therefore, the BJT 200 has high base resistance than the traditional BJT device. When the BJT 200 is operated, the electric holes 150 are transported from the source/drain feature 133 and the fin 130 of the emitter region 6 to the source/drain feature 113 and the fins 110 of the collector region 2, and not a huge amount is lost since no fins 120 exists between the fins 110 and fins 130. Although the electric holes 150 still need to pass through the base region 4 and has recombination, the electric holes 150 do not directly affected by the active region (e.g., the active region 20*a*, 20*b*, 20*c* or 20*d*) of the base region 4. Therefore, the electric holes 150 have high possibility to arrive in the collector region 2 for high beta achievement.

Figure 8D:
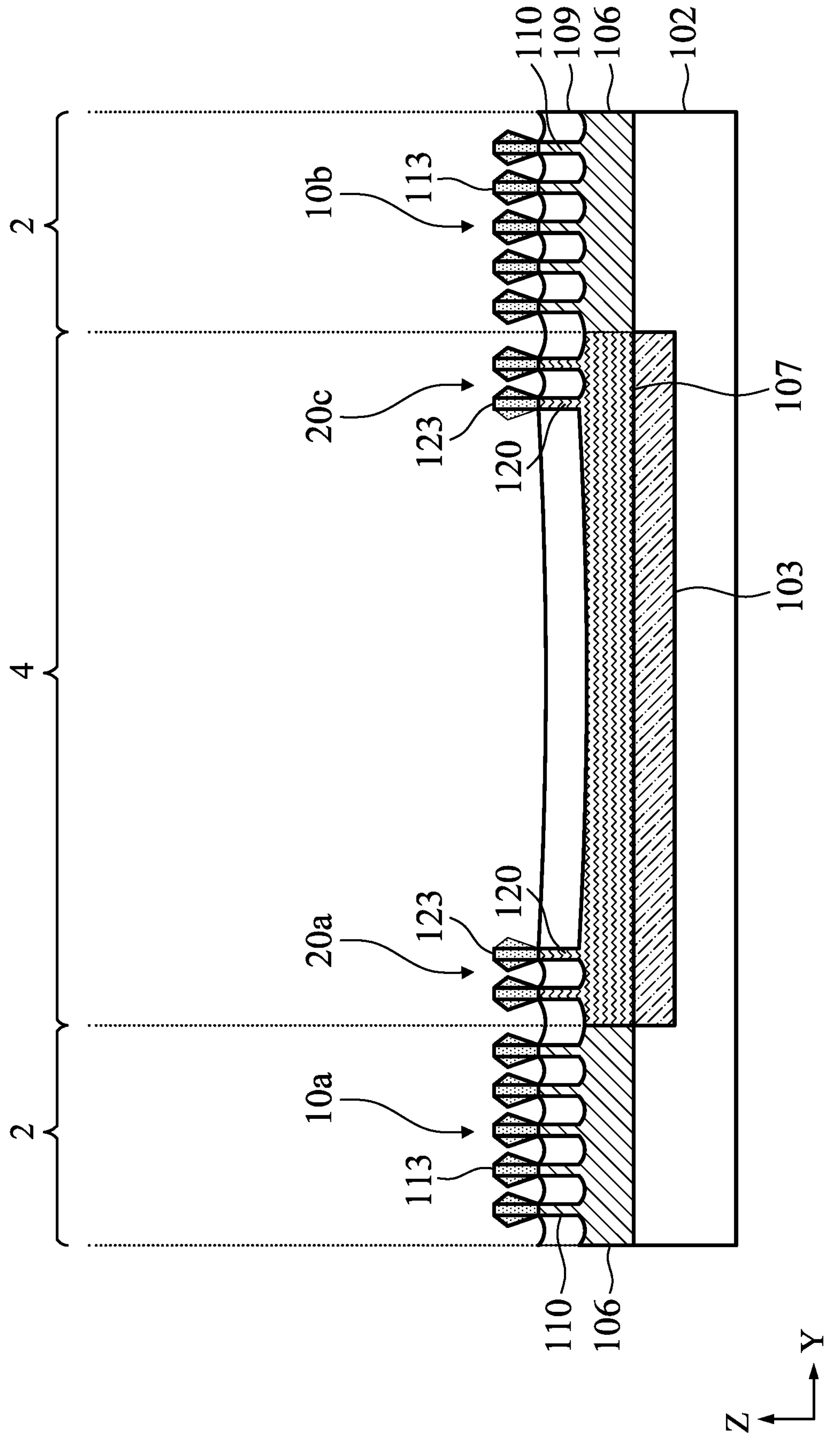
FIG. 8D shows a cross-sectional view of the semiconductor structure of the BJT along line G-G' of FIG. 6 and FIG. 7 according to some embodiments of the invention.

FIG. 8D shows a cross-sectional view of the semiconductor structure of the BJT 200 along line G-G' of FIG. 6 and FIG. 7 according to some embodiments of the invention. The deep N-type well region 103 is formed in the semiconductor substrate 102. The N-type well region 107 is formed over the deep N-type well region 103 and overlaps the deep N-type well region 103 in the Z direction. The P-type well region 106 is formed over the semiconductor substrate 102 and does not overlap the deep N-type well region 103 in the Z direction.

In FIG. 8D, the fins 120 of the active regions 20*a* and 20*c* are formed over the N-type well region 107, and the fins 120 are separated from each other by the STI 109. The source/drain feature 123 is epitaxially grown on the fins 120. In order to simplify the description, the floating gate structures between the source/drain feature 123 in the active regions 20*a* and 20*c* are omitted in FIG. 8D. The fins 110 of the active regions 10*a* and 10*b* are formed over the P-type well region 106, and the fins 110 are separated from each other by the STI 109. The source/drain feature 113 is epitaxially grown on the fins 110. In order to simplify the description, the floating gate structures between the source/drain feature 113 in the active regions 10*a* and 10*b* are omitted in FIG. 8D. In some embodiments, the number of the fins 120 in the active regions 20*a* and 20*c* is less than the number of the fins 110 in the active regions 10*a* and 10*b*.

In the embodiments, the BJT devices with base resistance are provided. In the BJT 100 and 200, no active region of the base region is disposed between the active regions of the emitter region and the active regions of the collector region. Therefore, the BJTs 100 and 200 have high base resistance than the traditional BJT device, thus increasing the beta gain. Therefore, the sigma of the mismatch voltage difference of the BJT of the embodiments is decreased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:

a semiconductor substrate;

a deep N-type well region formed in the semiconductor substrate;

a first P-type well region formed over the semiconductor substrate;

an N-type well region formed over the deep N-type well region, and surrounded by the first P-type well region;

a second P-type well region formed over the deep N-type well region, and surrounded by the N-type well region; and a bipolar junction transistor (BJT), comprising:

a first active region of a collection region formed over the first P-type well region, comprising a plurality of first fins extending in a first direction and a plurality of first source/drain features epitaxially grown on the plurality of first fins;

a second active region and a third active region of a base region formed over the N-type well region, each comprising a plurality of second fins extending in the first direction and a plurality of second source/drain features epitaxially grown on the plurality of second fins; and a fourth active region of an emitter region formed over the second P-type well region, comprising a plurality of third fins extending in the first direction and a plurality of third source/drain features epitaxially grown on the plurality of third fins, wherein the second active region and the third active region are disposed on opposite sides of the fourth active region in the first direction, wherein in the first direction, the first active region is longer than the fourth active region, and the fourth active region is longer than the second active region and the third active region, wherein in the first direction, the second active region and the third active region are not disposed along the emitter region, and wherein the second active region and the third active region are arranged on corners of the emitter region.

2. The semiconductor structure as claimed in claim 1, wherein in a second direction perpendicular to the first direction, a distance between the first active region and the second active region is equal to a distance between the first active region and the third active region.

3. The semiconductor structure as claimed in claim 1, wherein the plurality of first fins are longer than the plurality of third fins, and the plurality of third fins are longer than the plurality of second fins.

4. The semiconductor structure as claimed in claim 1, wherein a number of the plurality of second fins is less than a number of the plurality of first fins and a number of the plurality of third fins.

5. The semiconductor structure as claimed in claim 1, wherein the BJT further comprises:

a fifth active region of the collection region formed over the first P-type well region, comprising the plurality of first fins extending in the first direction and the plurality of first source/drain features epitaxially grown on the plurality of first fins, wherein the first active region and the fifth active region are disposed on opposite sides of the fourth active region in a second direction that is perpendicular to the first direction, wherein a number of the plurality of first fins in the first active region is equal to a number of the plurality of first fins in the fifth active region.

6. The semiconductor structure as claimed in claim 5, wherein the BJT further comprises:

a sixth active region and a seventh active region of the base region formed over the N-type well region, each comprising the plurality of second fins extending in the first direction and the plurality of second source/drain features epitaxially grown on the plurality of second fins, wherein the sixth active region and the seventh active region are disposed on opposite sides of the fourth active region in the first direction.

7. The semiconductor structure as claimed in claim 6, wherein the sixth active region is disposed between the second active region and the fifth active region, and the seventh active region is disposed between the third active region and the fifth active region, wherein the second active region, the third active region, the sixth active region, and the seventh active region have a same number of the plurality of second fins.

8. The semiconductor structure as claimed in claim 5, wherein the BJT further comprises:

an eighth active region of the emitter region formed over the second P-type well region, comprising the plurality of third fins extending in the first direction and the plurality of third source/drain features epitaxially grown on the plurality of third fins, wherein the eighth active region is disposed between the fourth active region and the fifth active region, wherein a number of the plurality of third fins in the fourth active region is equal to a number of the plurality of third fins in the eighth active region.

9. A semiconductor structure, comprising:

a semiconductor substrate;

a deep N-type well region formed in the semiconductor substrate;

a rectangular P-type well region formed over the deep N-type well region;

a ring-shaped N-type well region formed over the deep N-type well region, wherein the rectangular P-type well region is surrounded by the ring-shaped N-type well region;

a ring-shaped P-type well region formed over the semiconductor substrate, wherein the ring-shaped N-type well region is surrounded by the ring-shaped P-type well region; and a bipolar junction transistor (BJT), comprising:

a plurality of first active regions of a collection region formed over the ring-shaped P-type well region, each comprising a plurality of first fins extending in a first direction and a plurality of first source/drain features epitaxially grown on the plurality of first fins;

a plurality of second active regions of a base region formed over the ring-shaped N-type well region, each comprising a plurality of second fins extending in the first direction and a plurality of second source/drain features epitaxially grown on the plurality of second fins; and a plurality of third active regions of an emitter region formed over the rectangular P-type well region, each comprising a plurality of third fins extending in the first direction and a plurality of third source/drain features epitaxially grown on the plurality of third fins, wherein in the first direction, the plurality of first active regions are longer than the plurality of third active regions, and the plurality of third active regions are longer than the plurality of second active regions, wherein in the first direction, the plurality of second active regions are not disposed along the emitter region, and wherein the plurality of second active regions are arranged on corners of the emitter region.

10. The semiconductor structure as claimed in claim 9, wherein the plurality of second active regions are disposed on opposite sides of the plurality of third active regions in the first direction.

11. The semiconductor structure as claimed in claim 9, wherein the plurality of first fins are longer than the plurality of third fins, and the plurality of third fins are longer than the plurality of second fins.

12. The semiconductor structure as claimed in claim 9, wherein a number of the plurality of second fins in each of the plurality of second active regions is less than a number of the plurality of first fins in each of the plurality of first active regions.

13. The semiconductor structure as claimed in claim 9, wherein a number of the plurality of second fins in each of the plurality of second active regions is less than a number of the plurality of third fins in each of the plurality of third active regions.

14. The semiconductor structure as claimed in claim 9, wherein a number of the plurality of first fins in each of the plurality of first active regions is equal to a number of the plurality of third fins in each of the plurality of third active regions.

15. The semiconductor structure as claimed in claim 9, wherein the plurality of third active regions are disposed between the plurality of second active regions, and the plurality of second active regions and the plurality of third active regions are disposed between the plurality of first active regions.

16. The semiconductor structure as claimed in claim 9, wherein a number of the plurality of first active regions is equal to a number of the plurality of third active regions, and a number of the plurality of second active regions is greater than the number of the plurality of first active regions.

17. The semiconductor structure as claimed in claim 9, wherein a number of the plurality of second active regions is a sum of a number of the plurality of first active regions and a number of the plurality of third active regions.

18. The semiconductor structure as claimed in claim 1, wherein in the first direction and a second direction, the second active region, the third active region, and the emitter region are not arranged on a straight line, and wherein the second direction is perpendicular to the first direction and a stacking direction of the semiconductor substrate and the first P-type well region.

19. The semiconductor structure as claimed in claim 9, wherein in the first direction and a second direction, the plurality of second active regions and the emitter region are not arranged on a straight line, wherein the second direction is perpendicular to the first direction and a stacking direction of the semiconductor substrate and the rectangular P-type well region.

* * * * *